United States Patent [19]
Frach et al.

[11] Patent Number: 6,132,563
[45] Date of Patent: Oct. 17, 2000

[54] REACTIVE SPUTTERING PROCESS

[75] Inventors: Peter Frach, Radeberg; Hendrik Walde, Dresden; Christian Gottfried, Dresden; Klaus Goedicke, Dresden, all of Germany

[73] Assignee: Fraunhofer-Gesellschaft zur Forderung der angewandten Forschung e.V., Dresden, Germany

[21] Appl. No.: 08/894,645

[22] PCT Filed: Jan. 23, 1996

[86] PCT No.: PCT/DE96/00121

§ 371 Date: Sep. 30, 1997

§ 102(e) Date: Sep. 30, 1997

[87] PCT Pub. No.: WO96/26302

PCT Pub. Date: Aug. 29, 1996

[30] Foreign Application Priority Data

Feb. 24, 1995 [DE] Germany ............................ 195 06 515

[51] Int. Cl.[7] .................................................. C23C 14/34
[52] U.S. Cl. ............................ 204/192.13; 204/298.03; 204/298.07; 204/298.08; 204/298.2
[58] Field of Search .................... 204/192.13, 298.07, 204/298.08, 298.17, 298.11, 298.06, 298.03, 298.2

[56] References Cited

U.S. PATENT DOCUMENTS

| | | | |
|---|---|---|---|
| 4,428,811 | 1/1984 | Sproul et al. | 204/192 |
| 4,693,805 | 9/1987 | Quazi | 204/192.22 |
| 4,895,631 | 1/1990 | Wirz et al. | 204/192.13 |
| 5,108,571 | 4/1992 | Ludwig et al. | 204/192.13 |
| 5,169,509 | 12/1992 | Latz et al. | 204/298.03 |
| 5,334,302 | 8/1994 | Kubo et al. | 204/298.18 |
| 5,358,615 | 10/1994 | Grant et al. | 204/192.15 |
| 5,415,757 | 5/1995 | Szcyrbowski et al. | 204/298.08 |
| 5,476,838 | 12/1995 | Wordenweber et al. | 505/475 |
| 5,556,520 | 9/1996 | Latz | 204/192.13 |
| 5,607,559 | 3/1997 | Yamada et al. | 204/192.13 |
| 5,660,700 | 8/1997 | Shimizu et al. | 204/298.08 |
| 5,718,815 | 2/1998 | Szcyrbowski et al. | 204/298.06 |

FOREIGN PATENT DOCUMENTS 0 501 016  9/1992  European Pat. Off. ........ C23C 14/34

Primary Examiner—Nam Nguyen
Assistant Examiner—Julian A. Mercado
Attorney, Agent, or Firm—Greenblum & Bernstein, P.L.C.

[57] ABSTRACT

In magnetron-type reactive sputtering the properties of the deposited layer are to remain constant throughout the entire use of a target, independently of the state of erosion, even after an exchange of targets. The method is also to be applicable for magnetron sputtering sources having a target consisting of several components with different partial discharge powers.

Before sputtering of the substrates, the magnetic field strength associated with each partial target is set without reactive gas. Thereafter, a predetermined set of values of characteristic parameters is set by control of the reactive gas flow. During the subsequent sputtering the set of values predetermined for each partial target is kept constant by the controllable reactive gas flow. The first two steps are repeated at certain intervals in dependence of time the targets are used.

Optical coatings or corrosion protection coatings may be fabricated by reactive sputtering in accordance with this method.

21 Claims, 1 Drawing Sheet

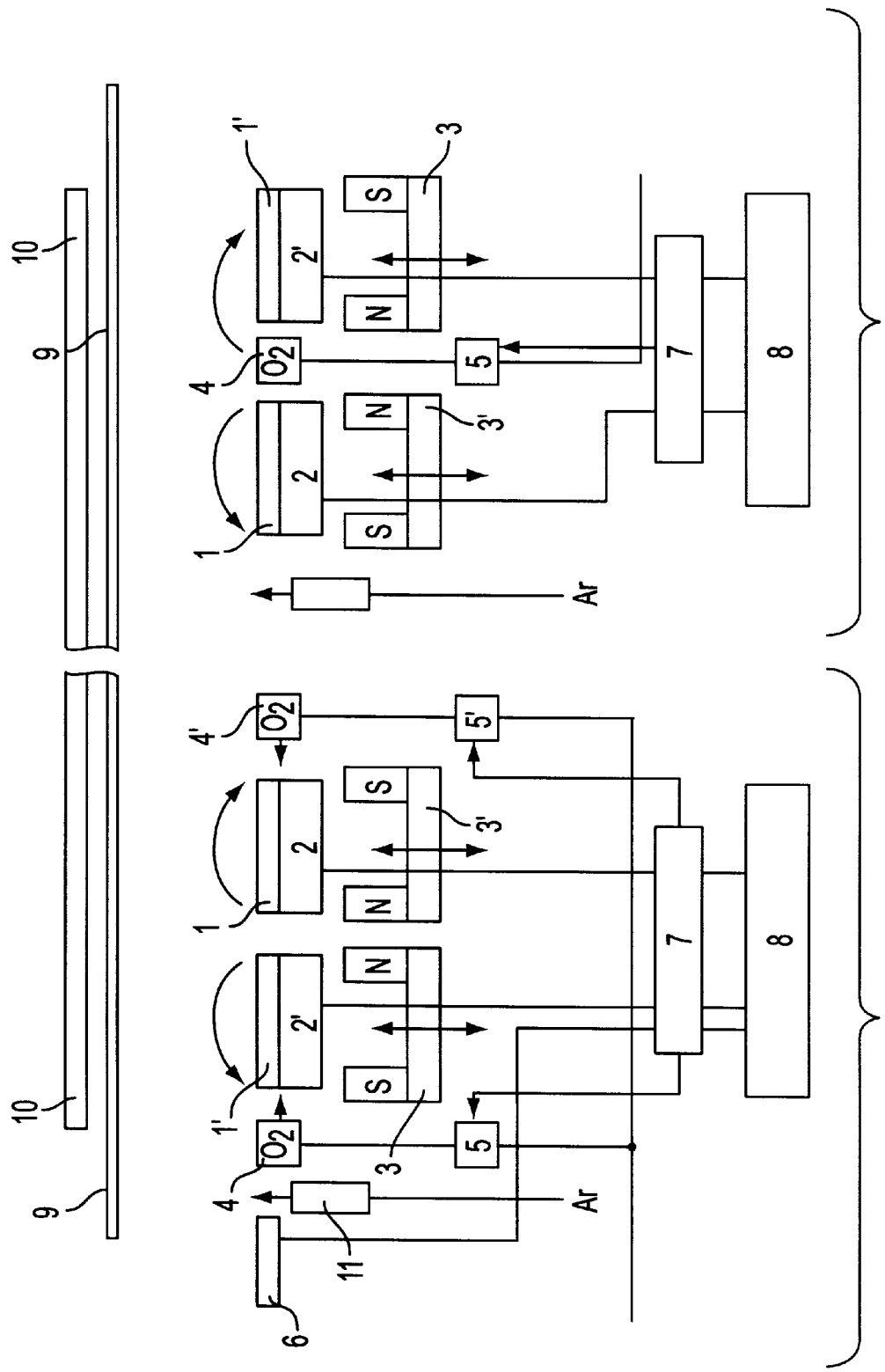

REACTIVE SPUTTERING PROCESS

BACKGROUND OF THE INVENTION

1. Field of the Invention

The invention relates to a method of reactive coating of substrates in a sputtering apparatus operating on the magnetron principle. For instance, coatings having optical properties or corrosion protection coatings may be fabricated by this method.

In reactive coating, an electrically conductive target, preferably Al, Ti, In, C, is sputtered. The introduction of reactive gases such as $O_2$, $N_2$, $H_2$, $C_xH_y$ and others into the discharge chamber leads to the formation of such compounds as $Al_2O_3$, $SiO_2$, TiN, for instance.

By guiding the discharge plasma in an integrally enclosed magnetic tunnel formed by arcuate curved magnetic field lines in front of the target, the density of the plasma and the sputtering rate are increased. The reactive magnetron discharge is determined, among others, by parameters depending upon the target material and upon the reaction gas. These parameters are the discharge current intensity and the discharge voltage which essentially define the operating point of the process. On account of the reactive gas component the magnetron discharge is provided with an additional degree of freedom. With a great many target reactive gas combinations instabilities occur at least in portions of the operating range. The discharge moves to a completely different operating point having different parameters and, therefore, other coating properties.

2. The Prior Art

For stabilizing the reactive magnetron discharge, it is known to select the partial pressures of the inert gas and the reactive gas such that the discharge current or the discharge voltage remains constant at a changing reactive gas pressure and to utilize the dependence of the discharge current or discharge voltage from the partial pressure of the reactive gas for controlling the reactive gas (DD 146,306). Furthermore, an analogous control process is known by which the operating point at the associated reactive gas flow is calibrated and maintained constant by metering of the introduced reactive gas (DE 4,106,513 A1). These processes suffer from the disadvantage of being suitable only for a relatively brief stabilization for a fraction of the target use time, since during the target use time the effective magnetic field strength and, hence, the discharge parameters and the reaction kinetics change as the depth of erosion increases, which leads to changed properties of the deposited layers. For this reason, the operating point requires constant adjustment in response to measured layer characteristics. Furthermore, these methods are of use only in connection with magnetron sputtering sources having but one discharge plasma. Furthermore, a reverse sputtering zone of increasing width is formed at the target edges as a result of the focussing effect of the erosion moat. Particularly with insulating layers such as $Al_2O_3$ or $SiO_2$, these reverse sputtering zones lead to arc discharges and, hence, to interfering particles in the deposited layer. A further significant disadvantage of the currently known solutions is that they do not allow the realization of a reactive sputtering process by several partial targets of the same or different partial output which is stable over a long period and is reproducible over the time of use of a target.

For depositing layers on substrates having a diameter in excess of 100 mm—with layer thicknesses and layer properties of very good homogeneity—it is also known to separate the target into several partial targets. In such a magnetron sputtering source, also known as a dual ring source, two partial targets are concentrically arranged with a discharge plasma burning in front of each partial target (DE 4,127,262 C1). The output density and, hence, the target erosion on the concentric partial targets differ from each other by a factor of 2 to 5, depending on the coating geometry. Therefore, the change of the plasma parameters differs significantly with increasing target erosion. In a non-reactive operation, it is possible and sufficient to set the uniformity of the coating thickness by selection of partial discharge outputs. A great disadvantage of the reactive operating mode of such a magnetron sputtering source resides in the excessively high demands put on the process to obtain a homogeneity of the stoichiometry which is stable over a long time and which is reproducible. The reasons for this are that the stability of the discharge, its operating point and, therefore, its stoichiometry are decisively determined by the ratio of output density to the supply of reactive gas. Some layer properties (e.g., the hardness) and the rate of deposit depend, aside from the stoichiometry, also upon the set values of the discharge voltage and/or the discharge current {P. Frach et al., *Surface and Coating Technology*, 59(1993) 177]. If only the partial discharge output is stabilized, it will in the end result in a drift of the coating properties and its homogeneity. Thus, for example, a brief localized variation in the flow of oxygen in the reactive sputtering of $Al_2O_3$, from the Al target, leads to a shift of the operating point of the discharge of the given partial target and, hence, to changed properties.

Furthermore, it is known to carry out reactive magnetron discharge by applying a pulsed voltage (alternating voltage) to two targets of different materials. The process parameters of discharge current and voltage and the gas pressure are measured by sensors and compared with a desired value. To obtain identical sputtering velocities of both targets, the signals obtained are processed in a control program to yield qualitatively good layer properties on the substrate (DE 4,324,683). The process suffers, however, from the fact that it is either not possible or difficult to control the discharge output or output density of the individual targets or partial targets independently of each other. The reason for this is that the required parameters for comparison with the desired value cannot be detected for each target or partial target.

TASK OF THE INVENTION

It is the task of the invention to maintain constant the properties of the deposited layer, such as chemical composition, physical properties during the coating of a substrate as well as during the entire time of use of a target, independently of the state of erosion. Even after changing a target, a renewed adjustment of the process, i.e. calibration or constant correction of the operating point in accordance with obtained layer properties, is to be avoided. The definition of characteristic layer properties is to serve only for a final quality control. The reverse sputtering zones are to be avoided or their spreading is to be reduced. The method is to be suitable for different types of magnetron sputtering sources with one target or a target consisting of several parts. The method is also to be applicable at different partial discharge power or power density for the partial targets. Also, the method is to make it possible rapidly to fabricate from electrically poorly conductive or insulating compounds such as $Al_2O_3$, $SiO_2$ layers of permanent properties and low particle density in the deposited layer.

BRIEF SUMMARY OF THE INVENTION

Accordingly, the invention provides for a method of reactively coating substrates by means of a sputtering source operating on the magnetron principle and comprising a target made up of at least one component, an adjustable magnet system for generating magnetic fields of selectively variable strengths, at least one controllable gas inlet and a source of pulsating power, the method being practiced by a first step of initially establishing, prior to sputtering of the substrates, a set of values of parameters characteristic of a non-reactive plasma by adjusting, in an atmosphere of inert gas, at least one of the magnetic field strength associated with each partial target and the feed time of the pulsating power, by a second step of establishing for each partial target a set of values of parameters characteristic of the reactive discharge by changing the discharge parameters while maintaining constant the set values of magnetic field strength by at least one of admission of one of reactive gas and a mixture of reactive and inert gases and by feeding pulsating power, by a third step of maintaining constant, during sputtering of the substrates, said predetermined set of values for at least a fraction of use of each partial target by controlling at least one of the gas flow and gas pressure and the power feed time, and by repeating said first and second steps in predetermined intervals before continuing sputtering.

Practicing the method in accordance with the invention demonstrates that it is possible to monitor and characterize the ratio of the plasma parameters to the reactive gas necessary for the reactive forming of a layer, solely by electrical measured values, and that the sputtering process may be controlled in a manner which is stable over an extended period and reproducible, by means of control circuits by setting of suitable determinative parameters, such as the magnetic field, the input time of the power supply and the flow of reactive gas. It is also possible optically and/or electrically to monitor the parameters characteristic of the plasma discharge. It is advantageous to utilize the ratio of the optical intensities of two characteristic spectral lines of the plasma discharge as an optical parameter. It is possible by this method to carry out the reactive deposition process over the time of use of a target and from one target to another, with the properties of the layers remaining the same. Therefore, constant monitoring of the properties of the layers and adjustment of the process parameters on the basis of the results of such monitoring is not necessary for an extended process operation. In this manner, the rate of rejects of the coated substrates is significantly reduced and automation leads to higher productivity and reduced costs.

By setting the individual magnetic field strength and/or the individual power feed time for each target it is possible to maintain the plasma parameters constant during the target erosion period free of the influence of the reactive gas. An individual pair of values, e.g. of discharge voltage and discharge current, at an average power over the duration of the period, is utilized as a measure for the setting. These electrical parameters may be kept constant during the target erosion; or they may also be determined by a single previously performed setting, e.g. for an Al target, in dependence of the target erosion and then used as control values for further targets made of the same material. Another positive effect is that target erosion occurs more uniformly and that the progressive formation of reverse sputtering zones is permanently avoided or strongly reduced. In this manner the tendency to arc discharges and the formation of particles in the deposited layer is avoided or drastically reduced.

No change in the magnetic field strength occurs during the reactive coating operation. An individual pair of values, e.g. of discharge voltage and discharge current, at an individual power are averaged over the duration of the period. These electrical parameters may be kept constant during the target erosion, or they may also be determined by a previously performed setting in dependence of the target erosion and then be used as control values for further targets made of the same material.

If sputtering is to take place during an unchangeable power input time, the setting and stabilizing of the operating point of the reactive discharge is performed by setting the flow of the reactive gas by means of a reactive gas control loop.

When practicing the method with a common reactive gas inlet for several partial targets it may advantageously be controlled by a set of values of parameters characteristic of the reactive discharge of a selected partial target, e.g. the one having the largest partial discharge output. For further partial targets, the operating point of the reactive discharge is set and stabilized by setting the individual power input time by means of a control loop. However, this method is equally suitable for magnetron sputtering sources with targets consisting of one part only.

The magnetic field may be generated by permanent magnets as well as by electromagnets or a combination thereof. A change in the magnetic field strength may be obtained either by mechanically adjusting the spacing of a permanent magnet system from the surface of the target and/or by a change of the current flowing in the coil of an electromagnet.

The duration of the period of intermittent feeding of power into the plasma may advantageously be in the range of several micro seconds up to several seconds. Period durations especially in the range of 5 micro seconds to 50 micro seconds result in an operation of particularly few arc discharges.

A further reduction in the tendency to arc discharges may be obtained by a low ohmic conductive connection between partial target and anode potential, with the voltage between the partial target and the anode being preferably less the 15 V. The use of an arc recognition circuit in the connection between the partial target and the anode of the discharge for switching off the input power and subsequent low ohmic conductive connection result in a reduction of power fed into the arc so that an infusion of particles into the deposited layer is prevented or significantly reduced.

For practicing the method it is of advantage to input power in such a way that during the input time the partial targets always act as cathodes of the discharge. Discharge occurs against a further electrode set as an anode which may be electrically insulated from the vacuum chamber, electrically connected with it or be a component of it.

If two partial targets are used, a further advantageous embodiment of the method includes one partial target being a cathode and the second partial target being an anode of the discharge. In the ensuing period the other target is either the cathode or the anode of the discharge. The alternation in the poling of the partial targets should be such that each partial target regularly functions once as an anode during each period in order to provide for cleaning of the partial target at predetermined intervals. The power input during the input times are independently selectable for both pole directions. If desired, at least one additional electrode may be set to an arbitrary electric potential during all periods. This arbitrary potential may, for instance, be an anode potential which has a favorable effect on the ignition behavior. In certain cases it may be useful to arrange at least one additional electrode as electrically floating. This has a stabilizing effect on the discharge and reduces the arc discharge tendency.

In accordance with a further advantageous embodiment of the method the ignition of the reactive discharge occurs in the inert gas—reactive gas mixture at a predetermined value of the reactive gas flow or partial pressure of the reactive gas and the operating point of the discharge is thereafter automatically set by the reactive gas control loop. In this manner intermediate layers of undesirable compositions, of the kind formed when the discharge is ignited in inert gas, may be avoided. In some combinations of target material and reactive gas the discharge in the inert gas—reactive gas mixture and at low discharge voltages or total pressures, ignites substantially better. Moreover, in this manner it is possible to achieve a coating without movement of a diaphragm between the magnetron sputtering source and the substrate. Such a diaphragm is required if the discharge is ignited in pure inert gas because a non-reactive layer would be formed until the operating point has been attained. On the other hand, this embodiment of the invention offers the advantage of the danger of the target being heavily covered by reactive products, since in some reactive processes the setting of the operating point with the target being covered is possible only after an unfavorably long sputtering time.

BRIEF DESCRIPTION OF THE SEVERAL DRAWINGS

The invention will be explained in more detail on the basis of two embodiments. In the associated drawings:

FIG. 1: is a semi-section of a magnetron sputtering source in unipolar operation;

FIG. 2: is a semi-section of a magnetron sputtering source in bipolar operation.

DETAILED DESCRIPTION OF PREFERRED EMBODIMENTS

The magnetron sputtering source of FIG. 1 consists of partial targets 1, 1', which are affixed to cooling plates 2, 2'. The magnets 3, 3' of the magnet system arranged behind the partial targets 1, 1' may be mechanically moved in the direction of the partial targets 1, 1', as is well known. A reactive gas inlet 4, 4' is provided on the side of each partial target 1, 1'. 5 and 5' designate control valves of the reactive gas inlet 4, 4'. Moreover, an additional electrode 6, a measurement signal detection and control unit 7 and a power input unit 8 are part of this magnetron sputtering source. The power input unit serves to provide a pulsating power for the partial targets 1, 1'. A substrate 10 is positioned over the partial targets 1, 1' behind a pivotal diaphragm 9. 11 designates an inert gas input arranged adjacent to the target.

In accordance with the invention, the method is practiced as follows: In a first step, before the reactive sputtering of the substrates 10, the magnetic field strength associated with each partial target 1, 1' is set in inert gas (argon) without feeding of reactive gas. To this end, argon is fed in through an inert gas inlet 11. The control valves 5, 5' are closed during this method step. At a predetermined power for each partial target 1, 1' the discharge burns between each partial target 1, 1' and the additional electrode 6 set as an anode. At this time a predetermined discharge current and a predetermined discharge voltage will be set for each partial target 1, 1'. By shifting the magnets 3, 3' associated with the partial targets 1, 1' the magnetic field strength of each partial target 1, 1' changes. This operation will continue until the predetermined characteristic parameters (discharge voltage and discharge current) have been set at each partial target 1, 1'. During this step, the pivotal diaphragm 9 shields the substrate 10 against the partial targets 1, 1'. In a next step, the magnetic field strength is maintained constant, i.e. the magnets 3, 3' are not moved. A constant flow of argon is set at the inert gas inlet 11. A predetermined discharge voltage is set and maintained constant at the power supply unit 8. Oxygen is fed through the reactive gas inlet 4, 4' so that the discharge will now burn in a reactive atmosphere. During this time, a predetermined discharge current and, hence, a predetermined discharge power will be set for each partial target. The given discharge current is monitored in a known fashion at the measuring value monitoring and control unit 7 and a signal is fed to the corresponding control valve 5, 5' so that the flow of oxygen is thus changed until each discharge power corresponds to the power predetermined for each partial target 1, 1'. During this step, the pivotal diaphragm 9 remains closed.

Sputtering of the substrate 10 is carried out during the next step. To this end, pulsating power is fed by the power supply 8 so that the discharge is burning in an argon-oxygen atmosphere between each partial target 1, 1' and the additional electrode 6. During this time the discharge currents of each partial target 1, 1' is monitored by the measuring value monitoring and control unit 7, and the oxygen flow is controlled by the control valves 5, 5' in such a manner that the discharge power of each partial target 1, 1' corresponds to the power predetermined for each partial target 1, 1'. Sputtering of the substrate 10 is now carried out with the pivotal diaphragm being open.

In order to ensure constant discharge conditions and, hence, constant coating properties, the first two steps of setting the magnetic field strength for each partial target 1, 1' and of controlling the oxygen flow for each partial target 1, 1' for conforming the discharge power to a predetermined power (without substrate) are repeated after a predetermined number of coatings. Thereafter the sputtering of the substrates 10 continues.

In FIG. 2 there is also shown a magnetron sputtering source which is different by the arrangement of only one reactive gas inlet 4 between the partial targets 1, 1'. There is no additional electrode 6, since this magnetron sputtering source is operated in a bipolar manner, i.e. the partial targets 1, 1' are alternatingly switched to function as cathodes and anodes.

The first two steps of the method of setting the magnetic field strength and the operating point are carried out as described in connection with FIG. 1. Since only one reactive gas inlet 4 is provided and since because of the different geometry the discharges have different parameters, the partial target 1 is first adjusted to a predetermined power by controlling the oxygen flow. The second partial target 1' thus has discharge parameters which deviate from a predetermined power. In order to adjust the discharge power of the second partial target 1' to the predetermined power, the power supply time of the power supply is changed until the measured power corresponds to the power predetermined for the second partial target 1'.

What is claimed is:

1. A method of reactively coating substrates with a magnetron sputtering source including partial targets composed of at least one component, a magnet system located behind each partial target, at least one controllable gas inlet, and a device that applies pulsed power into a plasma, the pulsed power having a period composed of a feed time and an intermission, the method comprising:

(a) prior to coating of the substrate, changing at least one of a magnetic field strength associated with each partial target or the feed time of the pulsed power in an inert gas without reactive gas at a discharge pressure, wherein a set of values of parameters characteristic of non-reactive plasma is obtained;

(b) prior to coating the substrates in a constantly maintained magnetic field for the partial targets, changing discharge parameters by at least one of (i) admitting one of a reactive gas or a reactive gas and an inert gas, or (ii) changing the feed time of the pulsed power for the partial targets, wherein a set of values of parameters characteristic of reactive discharge predetermined for each partial target is obtained;

(c) during sputtering, maintaining constant the predetermined set of values of parameters characteristic of reactive discharge for each partial target for at least a fraction of a duration of use of the partial targets by at least one of (i) controlling one of gas flow or gas pressure at the controllable gas inlet, or (ii) controlling a feed time of the pulsed power;

(d) repeating (a) and (b) at predetermined intervals during use of the partial targets, and subsequently continuing to coat the substrates.

2. The method of claim 1, further comprising forming the set of values of parameters characteristic of the plasma discharge from a value triplet of discharge voltage, discharge current and power fed into the plasma measured over a length of the period.

3. The method of claim 1, further comprising forming the set of values of parameters characteristic of the plasma discharge from a pair of values of discharge voltage and one of an optically or electrically derived signal representing a state of the plasma.

4. The method of claim 1, further comprising forming the set of values of parameters characteristic of the plasma discharge from a pair of values of discharge power and one of an optically or electrically derived signal representing a state of the plasma.

5. The method of claim 1, further comprising forming the set of values of parameters characteristic of the plasma discharge from a pair of values of discharge current and one of an optically or electrically derived signal representing a state of the plasma.

6. The method of claim 1, further comprising determining the set of values of parameters characteristic of the plasma discharge in accordance with a state of erosion over the duration of use of the partial targets.

7. The method of claim 6, wherein the formed set of values are one of the same or different in (a) or (b).

8. The method of claim 1, wherein a length of the period is set in a range of several micro seconds to several seconds.

9. The method of claim 1, wherein during the feed time, the partial targets are discharge cathodes, and wherein the discharge burns in a direction of at least one additional electrode provided in the discharge chamber, which is set as an anode.

10. The method of claim 9, further comprising feeding power such that during a length of the intermission, the partial targets are low-ohmically connected to an anode potential such that the voltage between the partial targets and the anode does not exceed 15 V.

11. The method of claim 1, wherein, during a given period, the method further comprises setting some of the partial targets as cathodes and setting at least one of the partial targets as an anode, wherein, during the feed time of a next period, the method further comprises switching a partial target from a cathode to an anode and switching the at least one partial target from the anode to a cathode, and wherein, for both pole directions, the method further comprises independently selecting feed times and power fed during the feed times.

12. The method of claim 11, wherein, during the periods, at least one additional electrode is set as an anode.

13. The method of claim 11, wherein during the periods, at least one additional electrode is set for an arbitrary electric potential.

14. The method of claim 1, further comprising determining an actual value of the supplied power used for controlling from multiplication of discharge voltage and discharge current, and forming an average value during a given period.

15. The method of claim 1, further comprising feeding one of the reactive gas or a reactive gas mixture into a discharge chamber adjacent to the partial targets.

16. The method of claim 1, further comprising igniting the discharge in inert gas without feeding of reactive gas; and automatically setting the operating point of the discharge by a reactive gas control loop.

17. The method of claim 1, further comprising igniting the discharge in a mixture of inert gas and reactive gas; and automatically setting the operating point of the discharge by a reactive gas control loop.

18. The method of claim 1, wherein during reactive sputtering, the method further comprises feeding power according to a constant power process; and setting a reactive gas flow by a reactive gas control loop, whereby one of a discharge voltage or a discharge current is stabilized at a predetermined value.

19. The method of claim 1, wherein during reactive sputtering, the method further comprises feeding power according to a constant power process; and setting a reactive gas flow by a reactive gas control loop, whereby one of a discharge power or a discharge current is stabilized at a predetermined value.

20. The method of claim 1, wherein during reactive sputtering, the method further comprises feeding power according to a constant current process; and setting a reactive gas flow by a reactive gas control loop, whereby one of a discharge voltage or a discharge power is stabilized at a predetermined value.

21. The method of claim 1, wherein, for some of the partial targets, reactive gas flow is maintained constant, and for other partial targets, the feed time of pulsed power is maintained constant, wherein the reactive gas flow and the feed time of pulsed power are maintained constant by several control loops on the basis of the predetermined set of values of the parameters characteristic of the reactive discharge predetermined for each partial target.

\* \* \* \* \*